United States Patent [19]
Nakamura et al.

[11] Patent Number: 5,414,305
[45] Date of Patent: May 9, 1995

[54] OUTPUT CIRCUIT HAVING CAPABILITY OF KEEPING LOGIC STATE OF SIGNAL SENT BETWEEN LOGIC CIRCUITS

[76] Inventors: Makoto Nakamura, 2-17-3 Mukonoso, Amagasaki-shi, Hyogo-ken; Takashi Nakajima, 608 Rapooru-Tenri, 2613-1 Ichinomoto-cho, Tenri-shi, Nara-ken, both of Japan

[21] Appl. No.: 132,363

[22] Filed: Oct. 6, 1993

[30] Foreign Application Priority Data

Oct. 13, 1992 [JP] Japan .................................. 4-273898

[51] Int. Cl.⁶ ............................................. H03K 5/153
[52] U.S. Cl. ........................................ 326/62; 327/73; 327/95
[58] Field of Search ............... 307/475, 352, 353, 358, 307/359, 279

[56] References Cited

U.S. PATENT DOCUMENTS

| | | | |
|---|---|---|---|
| 4,585,952 | 4/1986 | Yamamoto | 307/359 |
| 4,585,956 | 4/1986 | Lie | 307/359 |
| 4,588,905 | 5/1986 | Kojima | 307/358 |
| 4,700,365 | 10/1987 | Casey | 307/359 |

OTHER PUBLICATIONS

Technical Manual of LSI ":R3205", LSI Logic K.K., Apr. 29, 1990.

Primary Examiner—David R. Hudspeth
Assistant Examiner—Andrew Sanders
Attorney, Agent, or Firm—David G. Conlin; John L. Welch

[57] ABSTRACT

An output circuit is intended to be connected to any one of the circuits of a positive logic and a negative logic without having to initialize such a device as a register connected thereto. The output circuit is arranged to output a signal from a first logic circuit to a second logic circuit so that the first logic circuit is connected to an internal input terminal and the second logic circuit is connected to an external output terminal of the output circuit. The output circuit includes a logic state checking unit, a state storing unit, and a logic converting unit. The logic state checking unit serves to check the logic state of the external output terminal when initializing the first logic circuit. The state storing unit stores the checked logic state. The logic converting unit serves to compare the stored logic state of the output terminal with a logic state of a signal at the input terminal sent from the first logic circuit and determine the logic level of a signal to be fed to the second logic circuit.

5 Claims, 5 Drawing Sheets

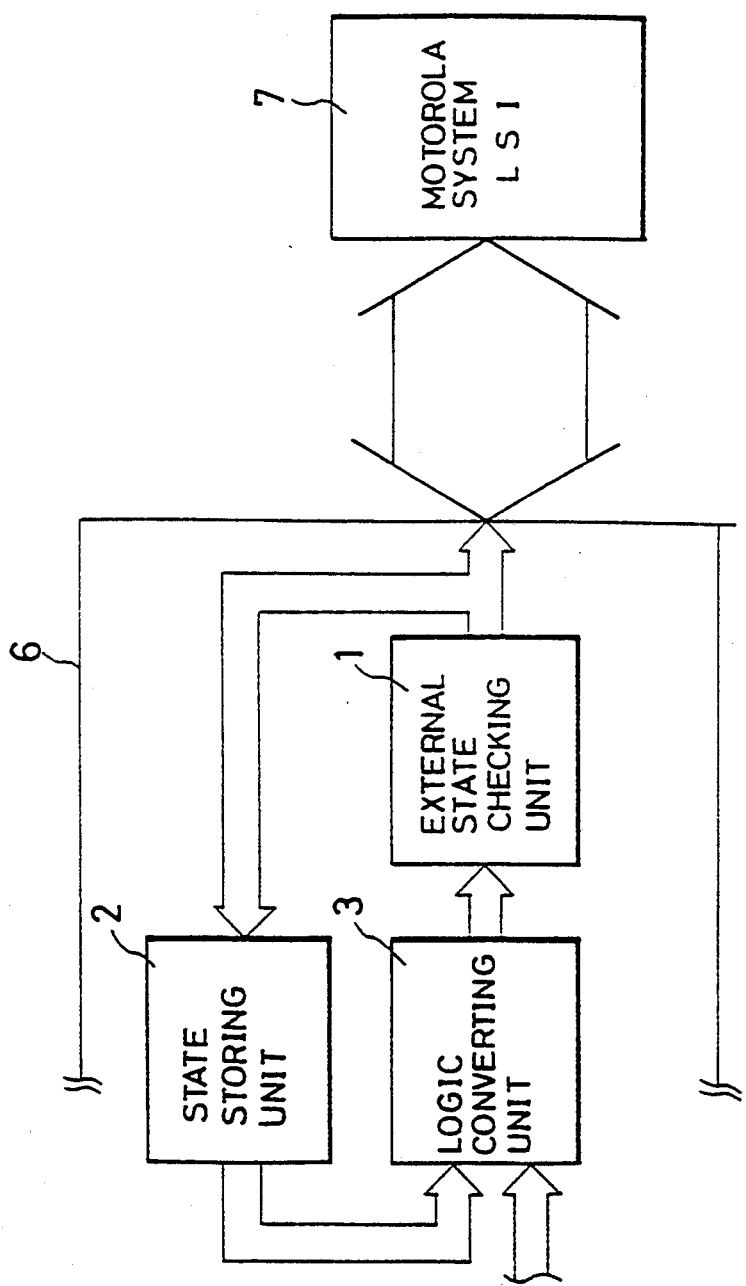

OUTPUT CIRCUIT HAVING CAPABILITY OF KEEPING LOGIC STATE OF SIGNAL SENT BETWEEN LOGIC CIRCUITS

BACKGROUND OF THE INVENTION

1. Field of the Invention

The present invention relates to an output circuit which is suitable for a logic circuit included in a semiconductor device or the like.

2. Description of the Related Art

The inventors of the present application know that the logic circuit used in an IC or LSI has its particular I/O logic level (positive or negative logic), that is, the I/O logic level depends on each kind of logic circuit. The known logic circuit is required to convert the positive logic to the negative logic or vice versa for connecting the circuits such as ICs or LSIs. To meet the requirement, the LSI provides some output pins with the corresponding additional circuits for changing the output logic. For example, a register is provided inside of the LSI so that the register may be initialized for determining if the logic is positive or negative.

That is, the known logic changing system utilizing a register needs to initialize the register. This initialization entails an additional component such as a circuit or a program. This has been a great disadvantage.

SUMMARY OF THE INVENTION

It is an object of the present invention to provide an output circuit which may be connected to any circuit of a positive or a negative logic without having to initialize the register.

In carrying out the object, an output circuit arranged to output a signal fed from a first logic circuit to a second output circuit and have an internal input terminal connected to the first logic circuit and an external output terminal connected to the second logic circuit, includes: means for detecting a logic level at the external output terminal when initializing the first logic circuit; means for holding the detected logic level; and means for comparing the held logic level with a logic level of a signal fed from the first logic circuit through the internal input terminal and determining a logic level of a signal to be fed to the second logic circuit based on the compared result.

In operation, when initializing the first logic circuit, a logic state of the external output is checked by means for detecting a logic level of the external output terminal. Then, this state is stored in the means for holding the detected logic level. The stored logic level at the external output terminal is compared with the logic level of the first logic circuit fed through the internal input terminal included in the output circuit for the purpose of determining the logic level of the signal to be fed to the second logic circuit.

According to the present invention, the output circuit enables to change an output logic by adjusting the resistance connected outside of the output circuit itself.

Further objects and advantages of the present invention will be apparent from the following description of the preferred embodiment of the invention as illustrated in the accompanying drawings.

BRIEF DESCRIPTION OF THE DRAWINGS

FIGS. 6a and 6b are block diagrams showing the output circuit according to the embodiment being connected to an LSI having a specific function.

DESCRIPTION THE PREFERRED EMBODIMENTS

Now, the description will be oriented to an output circuit according to an embodiment of the invention.

Figure 1:
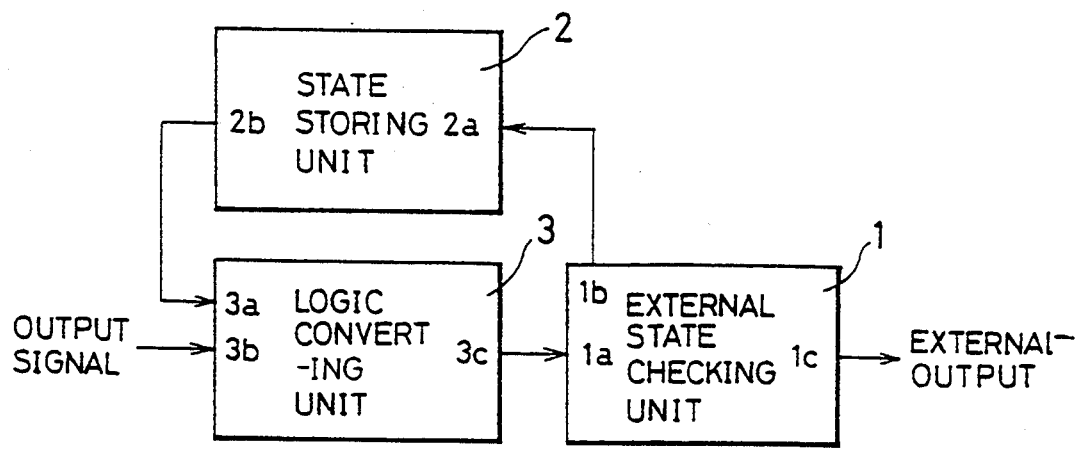
FIG. 1 is a block diagram showing an output circuit according to an embodiment of the present invention.

FIG. 1 is a block diagram showing an output circuit according to this embodiment. As shown, the output circuit is arranged to have an external state checking unit 1, a state storing unit 2, and a logic converting unit 3. The external state checking unit 1 has terminals 1a, 1b and 1c. The terminal 1c is connected to an external output. The terminal 1b is connected to a terminal 2a of the state storing unit 2. The state storing unit 2 has another terminal 2b connected to a terminal 3a of the logic converting unit 3. The logic converting unit 3 has two other terminals 3b and 3c. The terminal 3b is connected to an output terminal of a circuit at the previous stage so that the terminal 3b may receive an output signal from the previous stage circuit. The terminal 3c is connected to the terminal 1a of the external state checking unit 1.

Next, the operation of the output circuit will be described. The external state checking unit 1 serves to check the state of an external output when initializing the previous stage circuit, concretely, powering it on or resetting it. The checked state is sent from the terminal 1b to the terminal 2a of the state storing unit 2. The state storing unit 2 serves to store this state. Then, in the logic converting unit 3, the stored logic state is compared with the output signal from the circuit at the previous stage and the logic state is converted based on the compared result. Normally, for defining the logic of the external output signal, a pull-up or a pull-down resistor is connected to the output line. To keep the positive logic, the pull-down resistor is connected for keeping the logic at "L". To keep the negative logic, the pull-up resistor is connected for keeping the logic at "H".

Figure 2:
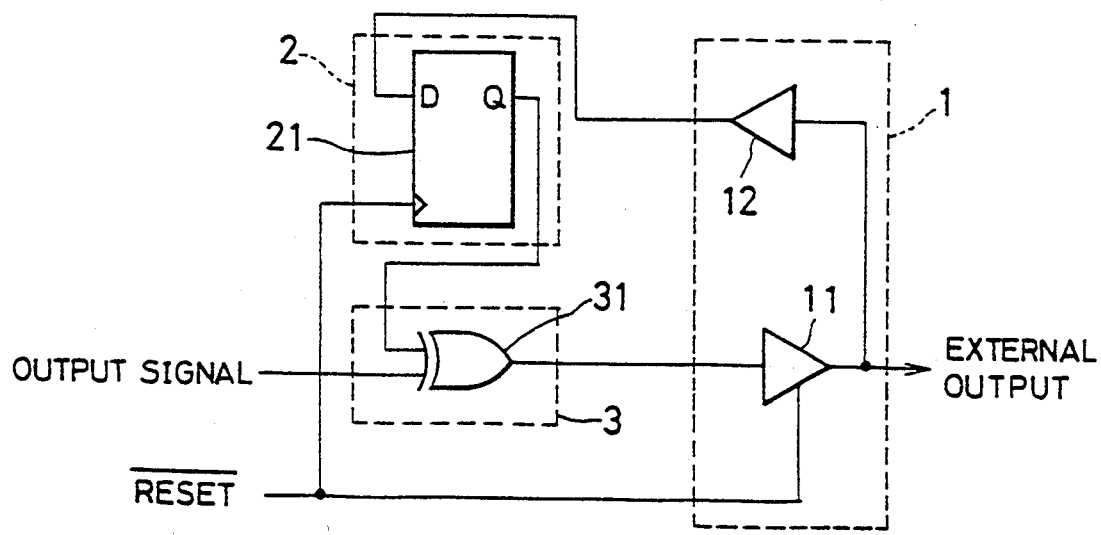
FIG. 2 is a circuit diagram showing a concrete arrangement of the output circuit shown in FIG. 1.

FIG. 2 is a circuit diagram showing a concrete output circuit shown in FIG. 1. In FIG. 2, the component having the same function as that of FIG. 1 has the same reference number. The external output line is connected to an output terminal of a tri-state buffer 11 and an input terminal of a sense buffer 12. The sense buffer 12 has an output terminal connected to an input terminal D of a D flip-flop 21. The D flip-flop 21 has an output terminal Q connected to an input terminal of an exclusive OR 31. The exclusive OR 31 has another input terminal connected to an output signal sent from the circuit at the previous stage and an output terminal connected to the input terminal of the tri-state buffer 11.

In the output circuit shown in FIG. 2, when initializing the previous stage circuit, the tri-state buffer 11 receives the signal $\overline{\text{RESET}}$ at a control terminal thereof and keeps its impedance high for checking the state of the resistor connected to the external output line. The D flip-flop 21 is triggered by the signal $\overline{\text{RESET}}$ given at the initialization for holding the signal sent from the sense buffer 12. Based on the output of the D flip-flop 21, the exclusive OR 31 serving as a logic determining circuit serves to convert the output logic level.

Figure 3:
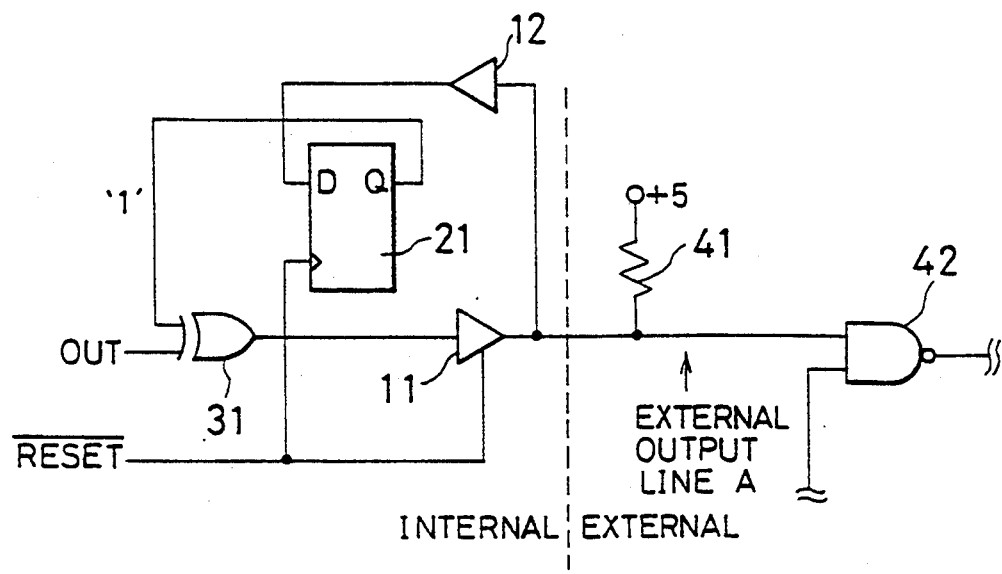
FIG. 3 is a circuit diagram showing the output circuit shown in FIG. 2 arranged for a negative logic.

FIG. 3 is a circuit diagram showing an output circuit which is arranged to set a negative logic by connecting a pull-up resistor to the external output line A. The external output line A is connected to the pull-up resistor 41 for constantly keeping the output state at "H". In response to a reset signal, the tri-state buffer 11 keeps its impedance high. The "H" state of the external output A is fed to the D flip-flop 21 through the sense buffer 12. The D flip-flop 21 latches an input value when the reset signal rises. After terminating the resetting operation, the tri-state buffer 11 serves as a normal buffer and outputs the converted signal onto the external output line A. The D flip-flop 21 keeps to hold the "H" value until it is reset. The exclusive OR 31 serving as the logic converting circuit performs logic conversion based on the output of the D flip-flop 21 for feeding the negative logic. The logic conversion is indicated in Table 1.

TABLE 1

|  | OUT | A |
|---|---|---|
| Assert | 1 | 0 |
| Negate | 0 | 1 |

Figure 4:
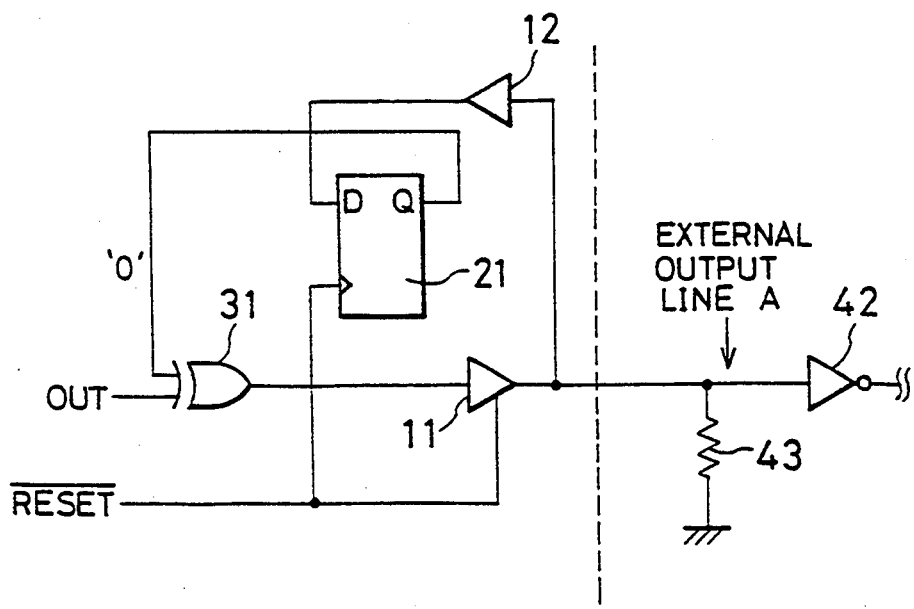
FIG. 4 is a circuit diagram showing the output circuit shown in FIG. 2 arranged for a positive logic.

FIG. 4 is a circuit diagram showing an output circuit which has a pull-down resistor 43 connected to the external output line A for setting the logic state of the output circuit as "positive". Like the negative logic circuit, the state "L" of the external output is checked and is stored in the D flip-flop 21. Based on this stored value, the exclusive OR 31 serves to perform logic conversion as indicated in Table 2 and feed a positive output.

TABLE 2

|  | OUT | A |
|---|---|---|
| Assert | 1 | 1 |
| Negate | 0 | 0 |

Figure 5:
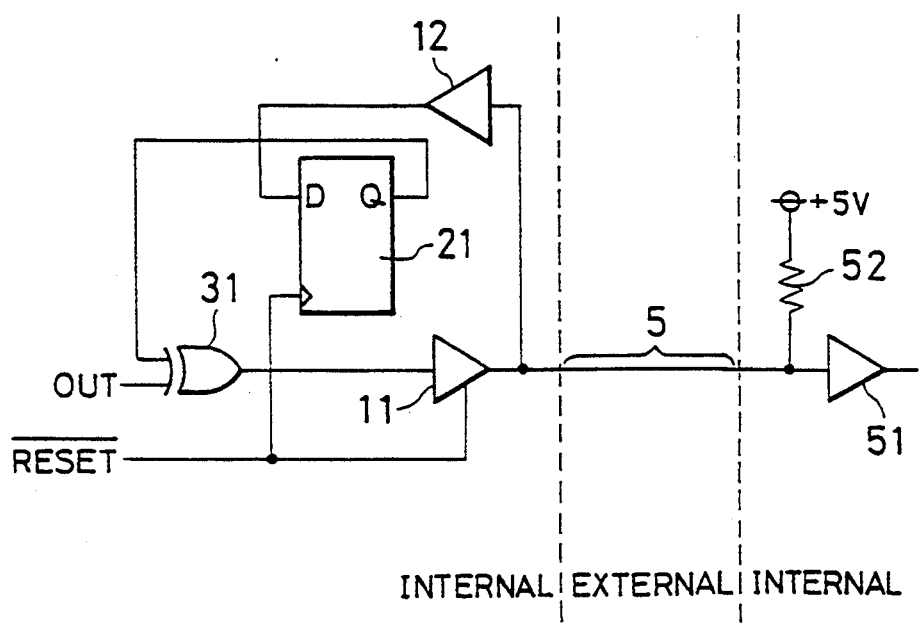
FIG. 5 is a circuit diagram showing the output circuit according to the embodiment being connected to an LSI having an internal resistor.

FIG. 5 is a circuit diagram showing a circuit arrangement which includes a resistor inside of an LSI package. The operation is the same as that shown in FIGS. 3 and 4. In this arrangement, what is required is just to perform pin-to-pin connection. This makes great contribution to reducing parts in number and occupied space since this type of connection can be done just on the substrate.

Figure 6B:
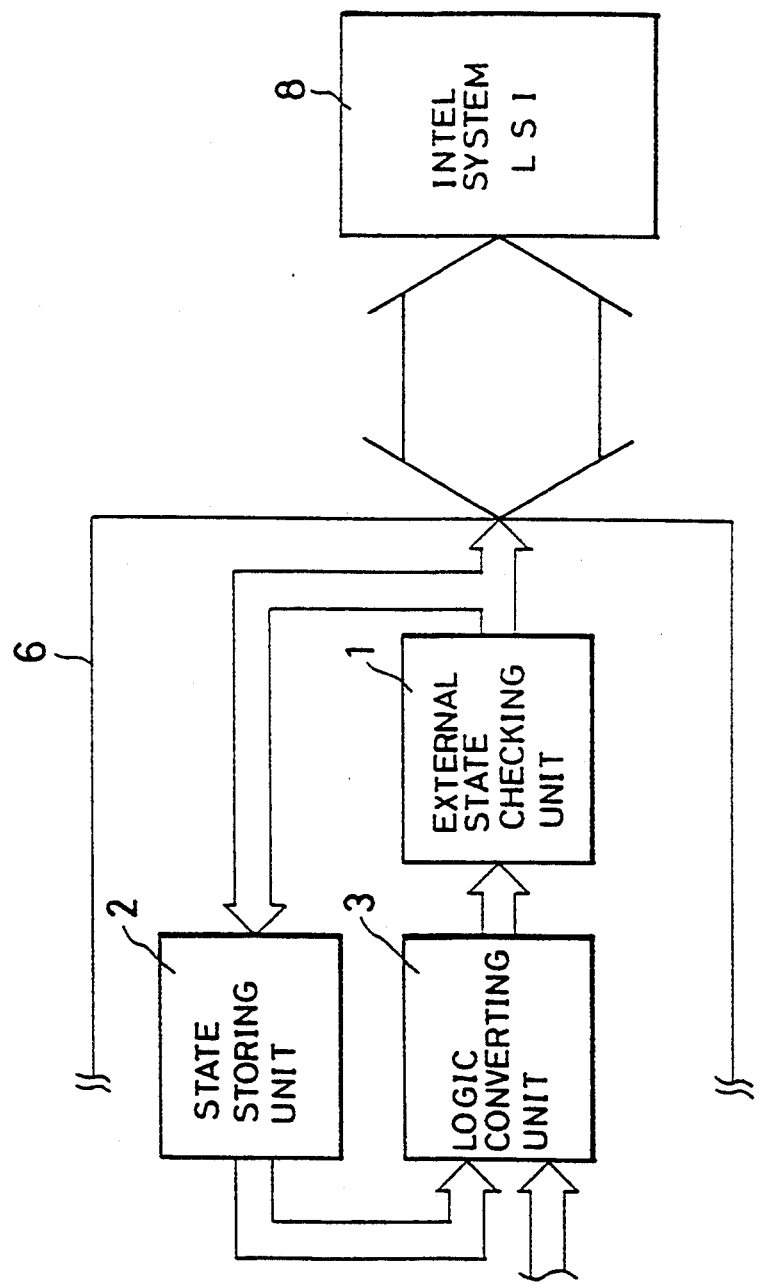

FIGS. 6a and 6b are circuit diagrams showing that an LSI 6 employing the output circuit according to this embodiment is connected to an LSI 7 or 8 having a specific function. Normally, this type of LSI 7 or 8 is directly connected to a CPU. Hence, the logics of I/O pins of the LSI are often predetermined so as to be matched to the logics of the specific CPU. It means that several kinds of LSIs, each for respective one of CPUs, having the same Function are prepared. According to the present invention, singe CPUs have different output logics respectively, it is possible to determine or specify the CPU by checking its output logic with the external state checking unit 1, and thus to convert the output logic of respective one of output pins of LSI 6 so as to be matched to the CPU connected.

FIG. 6a shows that the LSI 6 employing this output circuit of this embodiment is connected a Motorola system LSI 7. FIG. 6b shows the LSI 6 employing this output circuit of this embodiment is connected to Intel system LSI 8. The present invention may offset the difference between the different systems of LSIs to be connected so that the LSI 6 may be connected to either peripheral LSI 7 or 8 without having to add any external circuit.

Many widely different embodiments of the present invention may be constructed without departing from the spirit and scope of the present invention. It should be understood that the present invention is not limited to the specific embodiments described in the specification, except as defined in the appended claims.

What is claimed is:

1. An output circuit arranged to output a signal fed from a first logic circuit to a second logic circuit and having an internal input terminal connected to said first logic circuit and an external output terminal connected to said second logic circuit, comprising:

detecting means for detecting a logic level of said external output terminal when initializing said first logic circuit, said detecting means including a tri-state buffer to be controlled by a signal sent from the first logic circuit so that the tri-state buffer keeps its impedance high when initializing the first logic circuit, having an output terminal connected to said external output terminal and input terminal;

means for holding said detected logic level; and means connected to said input terminal of said tri-state buffer for comparing said held logic level with a logic level of a signal fed from said first logic circuit through said internal input terminal and for determining a logic level of a signal to be fed to said second logic circuit based on the compared result.

2. An output circuit arranged to output a signal fed from a first logic circuit to a second logic circuit and having an internal input terminal connected to said first logic circuit and an external output terminal to be connected to a pull-up resistor for setting an output in a negative logic and then to said second logic circuit, comprising:

detecting means for detecting a logic level of said external output terminal when initializing said first logic circuit;

means for holding said detected logic level; and means for comparing said held logic level with a logic level of a signal fed from said first logic circuit through said internal input terminal and for determining a logic level of a signal to be fed to said second logic circuit based on the compared result.

3. An output circuit arranged to output a signal fed from a first logic circuit to a second logic circuit and having an internal input terminal connected to said first logic circuit and an external output terminal to be connected to a pull-down resistor for setting an output in a positive logic and then to said second logic circuit, comprising:

detecting means for detecting a logic level of said external output terminal when initializing said first logic circuit;

means for holding said detected logic level; and means for comparing said held logic level with a logic level of a signal fed from said first logic circuit through said internal input terminal and for determining a logic level of a signal to be fed to said second logic circuit based on the compared result.

4. An output circuit as claimed in claim 1, wherein said holding means includes a D type flip-flop having an input connected to said external output terminal and an output terminal connected to said logic level determining means.

5. An output circuit as claimed in claim 1, wherein said logic level determining means includes an exclusive OR circuit having a first input connected to said output of said D type flip-flop, a second input connected to said internal input terminal, and an output connected to said tri-state buffer.

* * * * *

UNITED STATES PATENT AND TRADEMARK OFFICE
CERTIFICATE OF CORRECTION

PATENT NO. : 5,414,305
DATED : May 9, 1995
INVENTOR(S) : Makoto Nakamura and Takashi Nakajima It is certified that error appears in the above-indentified patent and that said Letters Patent is hereby corrected as shown below:

On the Title page, add item, " [73] Assignee:
                                    Sharp Kabushiki Kaisha, Osaka, Japan ".

Signed and Sealed this

Ninth Day of January, 1996

Attest:

BRUCE LEHMAN

*Attesting Officer*        *Commissioner of Patents and Trademarks*